(12) United States Patent
Kishi et al.

(10) Patent No.: US 11,204,374 B2
(45) Date of Patent: Dec. 21, 2021

(54) CURRENT SENSOR, AND MANUFACTURING METHOD FOR CURRENT SENSOR

(71) Applicant: Murata Manufacturing Co., Ltd., Nagaokakyo (JP)

(72) Inventors: Noritaka Kishi, Nagaokakyo (JP); Yasuhiro Shimizu, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 147 days.

(21) Appl. No.: 16/590,447

(22) Filed: Oct. 2, 2019

(65) Prior Publication Data
US 2020/0033384 A1 Jan. 30, 2020

Related U.S. Application Data

(63) Continuation of application No. PCT/JP2018/014569, filed on Apr. 5, 2018.

(30) Foreign Application Priority Data

Sep. 6, 2017 (JP) .............................. JP2017-171438

(51) Int. Cl.
*G01R 19/00* (2006.01)
*G01R 15/20* (2006.01)
*G01K 1/02* (2021.01)

(52) U.S. Cl.
CPC ......... *G01R 19/0092* (2013.01); *G01R 15/20* (2013.01); *G01R 19/0038* (2013.01); *G01K 1/02* (2013.01)

(58) Field of Classification Search
CPC .............. G01R 19/0092; G01R 15/20; G01R 19/0038; G01R 19/32; G01R 15/207; G01K 1/02
See application file for complete search history.

(56) References Cited

U.S. PATENT DOCUMENTS

2008/0094060 A1* 4/2008 Muraki .................. G01R 33/06
324/252
2010/0060275 A1* 3/2010 Veen .................. G01R 33/1269
324/228
(Continued)

FOREIGN PATENT DOCUMENTS

JP 05-4037 U 1/1993
JP 07-92199 A 4/1995
(Continued)

OTHER PUBLICATIONS

English translation of JP2006090706 (Year: 2006).*
Official Communication issued in International Patent Application No. PCT/JP2018/014569, dated Jul. 10, 2018.

*Primary Examiner* — Tung X Nguyen
*Assistant Examiner* — Feba Pothen
(74) *Attorney, Agent, or Firm* — Keating & Bennett, LLP

(57) ABSTRACT

A current sensor that outputs an output signal according to a signal magnetic field that is generated by a current to be measured is provided. The current sensor includes at least one magnetic sensor, a temperature sensor, an amplifier, and an offset adjusting circuit. The magnetic sensor generates a sensor signal commensurate with the signal magnetic field. The temperature sensor detects an ambient temperature. The amplifier amplifies the sensor signal at an amplification rate commensurate with the detected temperature and generates the output signal. The offset adjusting circuit adjusts an offset of the output signal. The offset adjusting circuit adjusts an offset in accordance with a relationship (mathematical expression) that holds between an output signal under no signal magnetic field and an amplification rate corresponding to the temperature.

18 Claims, 15 Drawing Sheets

(56) References Cited

U.S. PATENT DOCUMENTS

| | | | | |
|---|---|---|---|---|
| 2010/0117715 A1* | 5/2010 | Ariyama | ............ | G01R 33/0029 |
| | | | | 327/512 |
| 2013/0200881 A1* | 8/2013 | Chen | ...................... | G01R 15/20 |
| | | | | 324/117 R |
| 2015/0069997 A1 | 3/2015 | Kawahata et al. | | |
| 2018/0038897 A1* | 2/2018 | Milano | ................ | G01R 15/183 |
| 2018/0306843 A1* | 10/2018 | Bussing | ............... | G01R 15/207 |
| 2019/0033347 A1* | 1/2019 | Takano | .............. | G01R 19/0092 |

FOREIGN PATENT DOCUMENTS

| | | | |
|---|---|---|---|
| JP | 11-98602 A | | 4/1999 |
| JP | 2000-258162 A | | 9/2000 |
| JP | 2003-114244 A | | 4/2003 |
| JP | 2005-156324 A | | 6/2005 |
| JP | 2006-003209 A | | 1/2006 |
| JP | 2006090706 | * | 4/2006 |
| JP | 2008-072875 A | | 3/2008 |
| JP | 2008-141330 A | | 6/2008 |
| JP | 2010-181211 A | | 8/2010 |
| JP | 2012-098202 A | | 5/2012 |
| JP | 2016-161276 A | | 9/2016 |
| WO | 2014/006914 A1 | | 1/2014 |
| WO | WO-2014123007 A1 * | 8/2014 | ........... G01R 15/207 |

* cited by examiner

CURRENT SENSOR, AND MANUFACTURING METHOD FOR CURRENT SENSOR

CROSS REFERENCE TO RELATED APPLICATIONS

This application claims the benefit of priority to Japanese Patent Application No. 2017-171438 filed on Sep. 6, 2017 and is a Continuation Application of PCT Application No. PCT/JP2018/014569 filed on Apr. 5, 2018. The entire contents of each application are hereby incorporated herein by reference.

BACKGROUND OF THE INVENTION

1. Field of the Invention

The present invention relates to a current sensor that measures a current according to a magnetic field that is generated by the current, and a manufacturing method for the current sensor.

2. Description of the Related Art

International Publication No. WO 2014/006914 describes a manufacturing method for a current sensor for the purpose of achieving high current measurement accuracy with simple adjustment of the current sensor. The current sensor of International Publication No. WO 2014/006914 includes first and second amplifier correction circuits for separately correcting the temperature characteristics of offset in the output of the sensor and correcting the magnitude of offset. The manufacturing method of International Publication No. WO 2014/006914 sets first and second correction amounts for the first and second amplifier correction circuits of the current sensor based on the assumption that the temperature characteristics of offset can be expressed by a linear temperature equation.

SUMMARY OF THE INVENTION

Preferred embodiments of the present invention provide current sensors that each output an output signal according to a magnetic field that is generated by a current to be measured and that is able to reduce a temperature drift of the output signal, and manufacturing methods of the current sensors.

A current sensor according to a preferred embodiment of the present invention outputs an output signal according to a signal magnetic field that is generated by a current to be measured. The current sensor includes at least one magnetic sensor, a temperature sensor, an amplifier, and an offset adjusting circuit. The magnetic sensor generates a sensor signal commensurate with the signal magnetic field. The temperature sensor is configured to detect an ambient temperature. The amplifier is configured to amplify the sensor signal at an amplification rate corresponding to the detected temperature and generate the output signal. The offset adjusting circuit is configured to adjust an offset that is a deviation of an output signal from a reference value under no signal magnetic field. The offset adjusting circuit is configured to adjust the offset in accordance with a relationship that holds between an output signal under no signal magnetic field and an amplification rate corresponding to the temperature.

A manufacturing method of a current sensor according to a preferred embodiment of the present invention includes a step of preparing the current sensor, and a step of measuring an output signal of the current sensor at a first temperature. The method includes a step of measuring an output signal of the current sensor at a second temperature different from the first temperature, and a step of setting an offset adjusting circuit according to the output signal measured at the first temperature and the output signal measured at the second temperature.

With the current sensors and the manufacturing methods therefor according to preferred embodiments of the present invention, by setting the offset adjusting circuit, a temperature drift of an output signal in the current sensor that outputs the output signal according to a magnetic field that is generated by a current to be measured is reduced.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the current sensors and manufacturing methods therefor according to the present invention will be described with reference to the accompanying drawings.

The preferred embodiments are illustrative, and, partial replacements or combinations of components described in different preferred embodiments are possible. The description of matters the same as or similar to those of the first preferred embodiment is omitted in the second and following preferred embodiments, and only differences will be described. Particularly, similar operation and advantageous effects with a similar configuration will not be described one by one for each preferred embodiment.

First Preferred Embodiment

In a first preferred embodiment of the present invention, a current sensor that makes temperature compensation of a single magnetic sensor will be described.

1. Features and Structure

Figure 1:
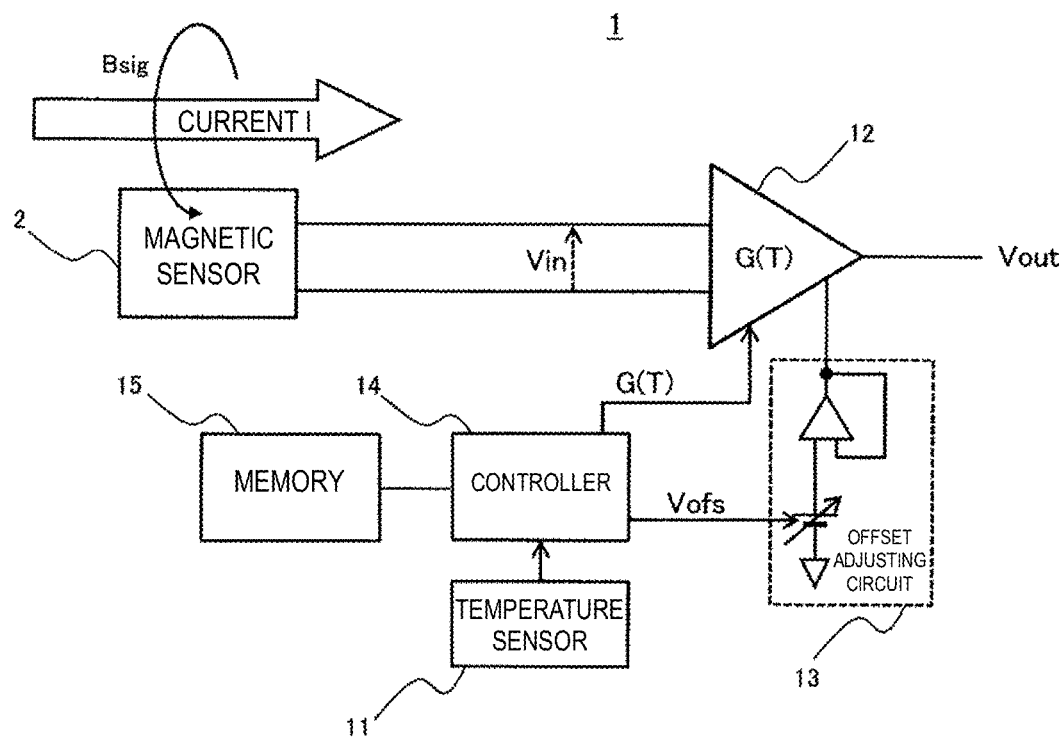
FIG. 1 is a diagram that shows a current sensor according to a first preferred embodiment of the present invention.

The current sensor according to the first preferred embodiment will be described with reference to FIG. 1. FIG. 1 is a diagram that shows the current sensor 1 according to the first preferred embodiment.

As shown in FIG. 1, the current sensor 1 according to the first preferred embodiment includes a magnetic sensor 2, a temperature sensor 11, an amplifier 12, an offset adjusting circuit 13, a controller 14, and a memory 15. The current sensor 1 is located adjacent to or in a vicinity of, for example, a busbar through which a current I to be measured flows.

The current sensor 1 measures the current I by detecting a magnetic field Bsig (hereinafter, referred to as signal magnetic field) that is generated by the flow of the current I with the magnetic sensor 2. In the current sensor 1 of the first preferred embodiment, as will be described later, bias magnets that magnetically bias the magnetic sensor 2 are used (see FIG. 2).

The magnetic sensor 2 preferably includes, for example, a magnetoresistance element. The magnetic sensor 2 has a unique sensitive axis and a magnetoelectric conversion gain. The magnetic sensor 2 senses a magnetic field along the direction of the sensitive axis and converts the sensed magnetic field to a sensor voltage Vin in accordance with the magnetoelectric conversion gain. The sensor voltage Vin is an example of a sensor signal in the first preferred embodiment. The features and structure of the magnetic sensor 2 will be described later.

The temperature sensor 11 is preferably, for example, a semiconductor temperature sensor. The temperature sensor 11 detects an ambient temperature T and outputs a signal of the detected result to the controller 14. The temperature sensor 11 is an example of a temperature sensor in the first preferred embodiment. For example, various temperature transducers, such as a thermistor, a thermocouple, a linear positive temperature coefficient resistor, and a platinum resistance thermometer sensor, may be used as the temperature sensor 11.

The amplifier 12 preferably includes, for example, a differential amplifier. The amplifier 12 includes an amplification rate adjusting circuit that is able to adjust an amplification rate G(T). The amplifier 12 generates an output voltage Vout by amplifying the sensor voltage Vin input from the magnetic sensor 2 in accordance with the amplification rate G(T) set in the amplification rate adjusting circuit. The output voltage Vout is an example of the output signal of the current sensor 1 in the first preferred embodiment. The amplifier 12 may include a single-end amplifier.

The offset adjusting circuit 13 is a circuit that adjusts an offset voltage in the output voltage Vout. The offset voltage is a voltage that represents a deviation from a reference value of the output voltage Vout under no signal magnetic field Bsig. In the first preferred embodiment, the offset adjusting circuit 13 is provided on the output side of the amplifier 12. The offset adjusting circuit 13 includes, for example, a variable voltage source, a buffer amplifier, and the like. The offset adjusting circuit 13 generates a voltage Vofs (offset adjusting value) of a value that is set in the variable voltage source and adds the generated voltage to the output of the amplifier 12. Thus, the offset adjusting circuit 13 adjusts the offset voltage.

The controller 14 controls the overall operation of the current sensor 1. The controller 14 preferably includes, for example, a CPU and other components that implement predetermined functions in cooperation with software. The controller 14 executes various computation processes by reading data and programs stored in the memory 15, thus implementing various functions. The controller 14 may include an A/D (analog-to-digital) converter, a D/A (digital-to-analog) converter, and the like. For example, the controller 14 controls the amplification rate adjusting circuit of the amplifier 12 or controls the variable voltage source of the offset adjusting circuit 13 based on a signal from the temperature sensor 11.

The memory 15 is a storage medium that stores programs and data that implement the functions of the controller 14, and is preferably, for example, a flash memory. For example, the memory stores a data table, or the like, that associates the amplification rate G(T) and the offset adjusting value Vofs with the temperature T.

The controller 14 may be a hardware circuit, such as an exclusive electronic circuit designed to implement predetermined functions and a reconfigurable electronic circuit. The controller 14 may be any one of various semiconductor integrated circuits, such as a CPU, an MPU, a microcomputer, a DSP, an FPGA, and an ASIC, for example.

1-1. Bias Magnets

Figure 2:
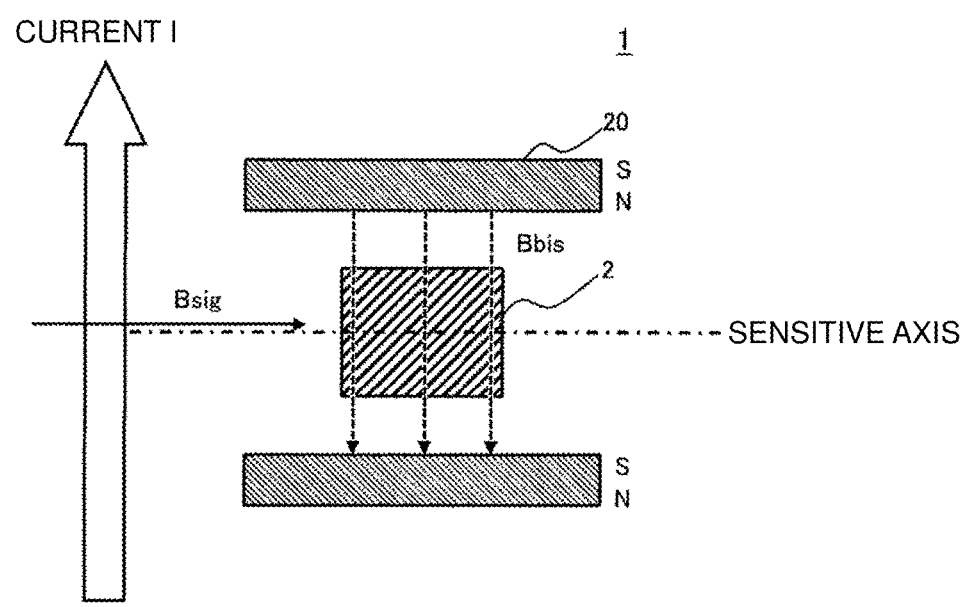
FIG. 2 is a view that shows an example of an arrangement of bias magnets in the current sensor.

The bias magnets 20 in the current sensor 1 will be described with reference to FIG. 2. FIG. 2 is a view that shows an example in which the bias magnets 20 are disposed in the current sensor 1.

As shown in FIG. 2, the current sensor 1 according to the first preferred embodiment further includes the two bias magnets 20. The bias magnets 20 are an example of a magnetic field source that generates a magnetic field Bbis (hereinafter, referred to as bias magnetic field) that biases the magnetic sensor 2. For example, a bulk magnet, such as ferrite and SmCo, a thin film magnet, or the like, may be used as the bias magnets 20.

In the example shown in FIG. 2, the two bias magnets 20 are disposed at positions facing each other via the magnetic sensor 2. The magnetic sensor 2 is disposed at the center position between the bias magnets 20 in an orientation in which the sensitive axis is parallel or substantially parallel to the direction of the signal magnetic field Bsig. The two bias magnets 20 are disposed in an orientation in which the long-side direction of each bias magnet 20 is parallel or substantially parallel to the sensitive axis of the magnetic sensor 2. The above-described arrangement is performed within the range of tolerance as needed in consideration of mounting accuracy, or the like, at the time of manufacturing of the current sensor 1.

In the example of FIG. 2, the north pole and south pole of each bias magnet 20 are arranged in the width direction of the bias magnet 20. In the two bias magnets 20, the north pole of one of the bias magnets 20 faces the south pole of the other.

With the bias magnets 20, the bias magnetic field Bbis in the region between the bias magnets 20 intersects with the direction of the sensitive axis adjacent to or in a vicinity of the magnetic sensor 2. A magnetic field orthogonal or substantially orthogonal to the sensitive axis in the magnetic sensor 2 is applied, so the dynamic range of the magnetic sensor 2 can be adjusted.

In the above description, the example in which the two bias magnets 20 are used in the current sensor 1 is described. The number of the bias magnets in the current sensor 1 is not limited to two and may be one or three or more. Alternatively, a magnet (magnetic field source) for a purpose other than biasing of the magnetic sensor 2 may be used in the current sensor 1.

1-2. Magnetic Sensor

Figure 3:
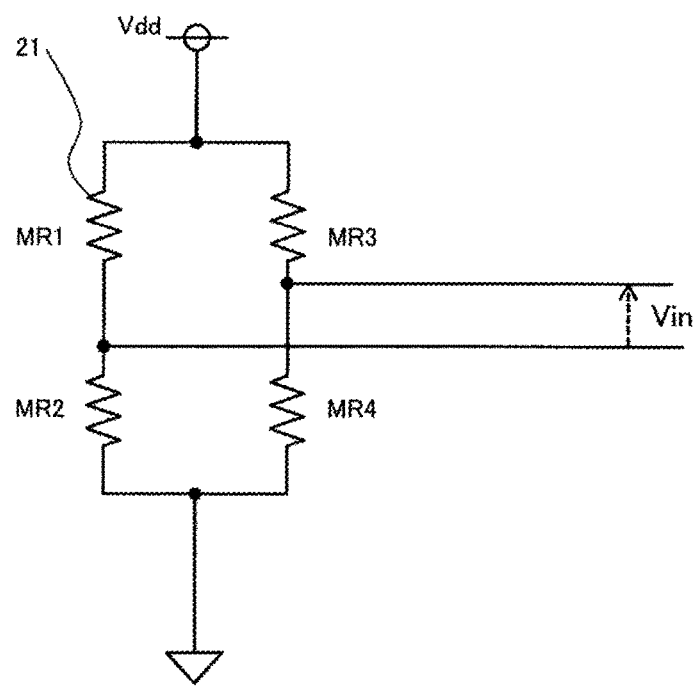
FIG. 3 is a circuit diagram that shows a magnetic sensor in the current sensor.

The features and structure of the magnetic sensor 2 in the current sensor 1 will be described with reference to FIG. 3. FIG. 3 is a circuit diagram that shows the magnetic sensor 2 in the current sensor 1.

In the example shown in FIG. 3, the magnetic sensor 2 includes four magnetoresistance elements 21. Each magnetoresistance element 21 is preferably, for example, an AMR (anisotropic magneto resistance) element. The magnetic sensor 2 is, for example, driven at a constant or substantially constant voltage of a power supply voltage Vdd. In the magnetic sensor 2 of this example, the four magnetoresistance elements 21 make up a Wheatstone bridge circuit, and output a sensor voltage Vin as a voltage difference between two connection points.

The above features and structure of the magnetic sensor 2 is one example and is not limited thereto. For example, the magnetic sensor 2 may be a half-bridge circuit including two magnetoresistance elements. Each of the magnetoresistance elements 21 of the magnetic sensor 2 is not limited to an AMR element, and may be any one of various MR elements, such as GMR (giant magneto resistance), TMR (tunnel magneto resistance), BMR (balistic magneto resistance), and CMR (colossal magneto resistance).

A magnetic element including a Hall element, a magnetic element including an MI (magneto impedance) element that uses a magnetic impedance effect, a flux gate magnetic element, or the like, may be used as the magnetic sensor 2. Constant current driving, pulse driving, or another driving method, may be employed as a method of driving the magnetic sensor 2.

2. Operation

The operation of the current sensor 1 will be described below.

The basic operation of the current sensor 1 according to the first preferred embodiment will be described. In the current sensor 1, the magnetic sensor 2 generates a sensor voltage Vin according to a sensed magnetic field, such as a signal magnetic field Bsig. The current sensor 1 computes the following mathematical expression (1) based on the sensor voltage Vin of the magnetic sensor 2, and outputs the output voltage Vout.

$$V\text{out}=G(T)\times V\text{in}+V\text{ofs} \qquad (1)$$

Specifically, the amplifier 12 of the current sensor 1 amplifies the sensor voltage Vin at the amplification rate G(T) and generates the output voltage Vout. In addition, the offset adjusting circuit 13 incorporates the offset adjusting value Vofs to the output voltage Vout as expressed by the mathematical expression (1).

In the first preferred embodiment, the amplification rate G(T) and offset adjusting value Vofs that are used to compute the mathematical expression (1) are controlled by the controller 14. Thus, temperature compensation of the current sensor 1 is performed, and the output voltage Vout satisfies the following mathematical expression (2) for the signal magnetic field Bsig.

$$V\text{out}=k\times B\text{sig} \qquad (2)$$

In the mathematical expression (2), k is a constant for unit conversion between the output voltage Vout of the current sensor 1 and the signal magnetic field Bsig based on the current I to be measured.

In the current sensor 1, the temperature sensor 11 detects an ambient temperature T. The controller 14 reads the amplification rate G(T) and offset adjusting value Vofs corresponding to the temperature T from the memory 15 based on the temperature T detected by the temperature sensor 11. The controller 14 sets the read amplification rate G(T) in the amplifier 12 and sets the read offset adjusting value Vofs in the offset adjusting circuit 13.

Through the above operation, the current sensor 1 detects a signal magnetic field Bsig while making temperature compensation, and is able to accurately measure the current I corresponding to the signal magnetic field Bsig. In the first preferred embodiment, the accuracy of temperature compensation is significantly improved by setting the amplification rate G(T) and offset adjusting value Vofs prestored in the memory 15 of the current sensor 1 to appropriate values. The details of temperature compensation of the current sensor 1 according to the first preferred embodiment will be described later.

2-1. Temperature Drift

Figure 4A:
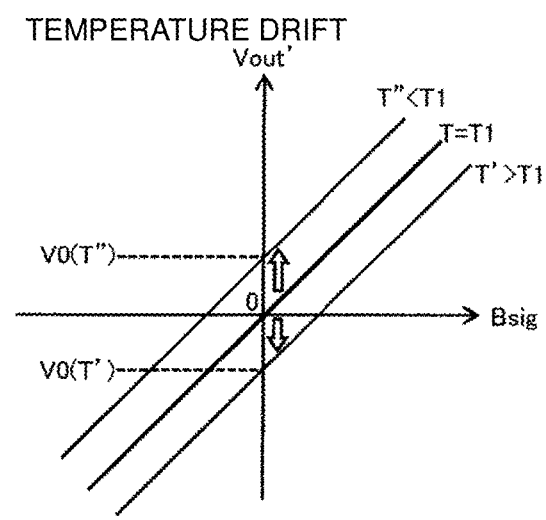
FIGS. 4A and 4B show graphs of temperature drift in the current sensor.
Figure 4B:
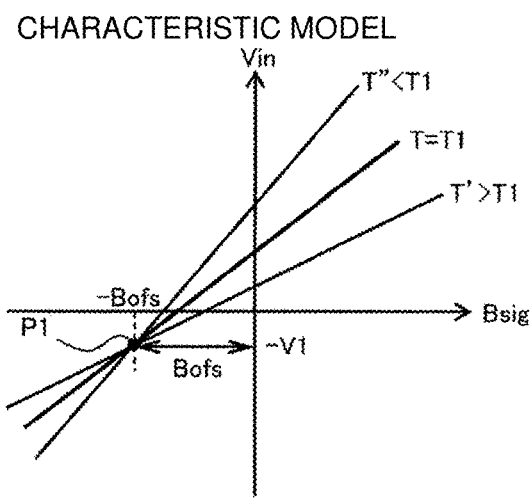

Regarding the above-described temperature compensation of the current sensor 1, the inventors of preferred embodiments of the present invention made diligent research and obtained findings on a problem of temperature drift. The findings of the inventors of preferred embodiments of the present invention will be described with reference to FIGS. 4A and 4B and FIGS. 5A to 5E. FIGS. 4A and 4B show graphs of temperature drift in the current sensor.

FIG. 4A is a graph that shows the input and output characteristics of the current sensor having a temperature drift in offset voltage V0(T). The graph of FIG. 4A shows the characteristic lines of input and output characteristics that the current sensor outputs an output voltage Vout' (ordinate axis) when a signal magnetic field Bsig (abscissa axis) is input at various temperatures T. The offset voltage V0(T) represents a deviation from a reference value "0" at the output voltage Vout' when the signal magnetic field Bsig is zero at the temperature T.

In FIG. 4A, it is assumed that an offset adjusting value in the current sensor is set by using, for example, the offset voltage V0(T1) measured at only the specific temperature T1. it is assumed that the amplification rate G(T) of the current sensor is appropriately set (see the mathematical expressions (1), (2)). For this reason, the slopes of the characteristic lines are constant or substantially constant over various temperatures T.

In FIG. 4A, at a temperature T' higher than the specific temperature T1 at which the above-described offset adjustment is performed, the offset voltage V0(T') deviates from "0". At a temperature T" lower than the temperature T1 as well, the offset voltage V0(T") deviates from "0". In other words, in the current sensor, there is a problem that the offset voltage V0(T) varies according to the temperature T and a temperature drift occurs.

The above-described problem of temperature drift was found through the research of the inventors of the subject application. The inventors of the subject application made diligent analysis to eliminate the problem and, as a result, found the characteristic model as shown in FIGS. 4A and 4B for the current sensor 1. FIG. 4B is a graph that shows the characteristic model of the current sensor 1.

The graph of FIG. 4B shows the characteristic lines of input and output characteristics that the magnetic sensor 2 (FIG. 1) in the current sensor 1 outputs sensor voltages Vin (ordinate axis) according to signal magnetic fields Bsig (abscissa axis) input at various temperatures T. Since the sensor voltage Vin from the magnetic sensor 2 is not amplified (not corrected) by the amplification rate G(T) (see the mathematical expression (1)), the characteristic lines of the sensor voltage Vin, shown in FIG. 4B, have different slopes at different temperatures T.

The characteristic model of FIG. 4B is a model with the characteristic lines of sensor voltages Vin over the range from the higher temperature T' to the lower temperature T" intersect at one intersection point P1 while the slopes vary according to the temperature T. The inventors of the subject application found the characteristic model by analyzing the input and output characteristics of a large number of the current sensors 2 made from an AMR element. The inventors also found that individual current sensors 1 including the magnetic sensor 2 had a unique intersection point P1. The characteristic model can be expressed by the following mathematical expression (3).

$$Vin = A(T) \lambda (Bsig + Bofs) - V1 \qquad (3)$$

In the mathematical expression (3), A(T) is the magnetoelectric conversion gain of the magnetic sensor 2 at the temperature T, and corresponds to the slope of the characteristic line in FIG. 4B. Bofs and V1 are unique parameters in each individual current sensor 1, and correspond to the coordinates (−Bofs, −V1) of the intersection point P. Hereinafter, Bofs is referred to as offset magnetic field, and V1 is referred to as voltage parameter.

According to the above characteristic model, an offset voltage V0(T) for the sensor voltage Vin in the mathematical expression (3) is calculated. In the first preferred embodiment, an offset adjusting value Vofs that cancels the offset voltage V0(T) for the mathematical expression (3) is set (the details will be described later). Accordingly, a temperature drift in the current sensor 1 is reduced.

2-1-1. Offset Magnetic Field

In the above-described characteristic model, it is presumed that the offset magnetic field Bofs is due to, for example, variations in mounting of the bias magnets 20 and magnetic sensor 2. FIGS. 5A to 5E show examples of arrangement of mounting variations.

Figure 5A:
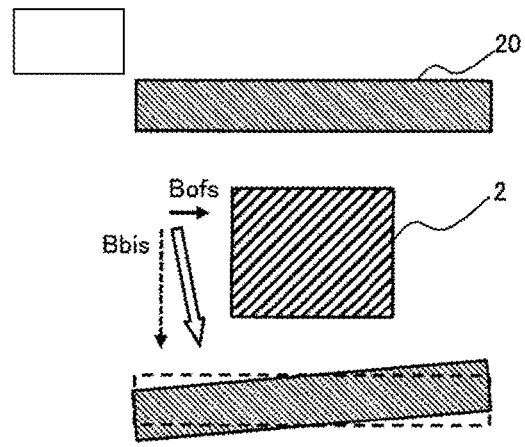
FIGS. 5A to 5E show examples of arrangement of variations in mounting of the current sensor.

FIG. 5A shows an example of arrangement in which the two bias magnets 20 deviate from an orientation parallel or substantially parallel to each other. In the current sensor 1, such arrangement that the direction of the bias magnetic field Bbis between the bias magnets 20 and the direction of the signal magnetic field Bsig are orthogonal to each other is ideal (see FIG. 2); however, in mounting, it is assumed that arrangement can deviate from the ideal arrangement as shown in, for example, FIG. 5A. In this case, it is presumed that a component of the bias magnetic field Bbis in the same direction as the signal magnetic field Bsig or a component parallel or substantially parallel to the direction of the sensitive axis is the offset magnetic field Bofs.

The voltage parameter V1 corresponds to a sensor voltage Vin (=−V1) that the magnetic sensor 2 outputs when the signal magnetic field Bsig (=−Bofs) that cancels the offset magnetic field Bofs is input to the current sensor 1. It is presumed that the voltage parameter V1 is due to, for example, variations including the temperature characteristics, and the like, of the magnetoresistance element 21 (FIG. 3) in the magnetic sensor 2.

Figure 5B:
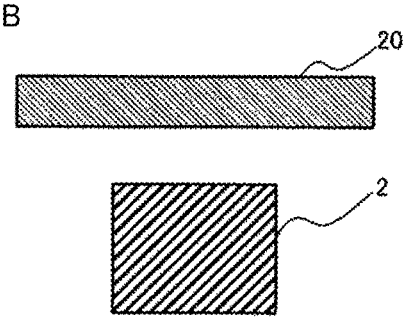
Figure 5C:
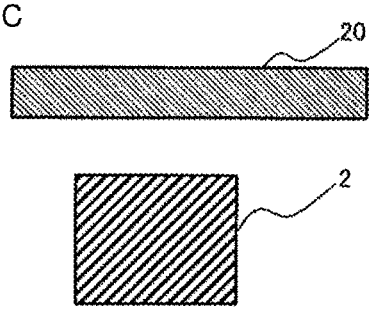
Figure 5D:
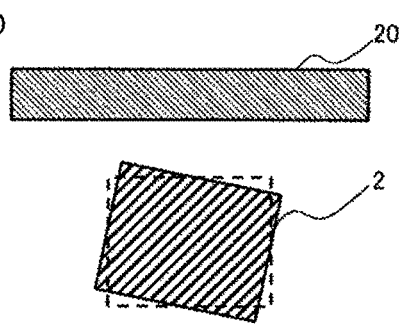
Figure 5E:
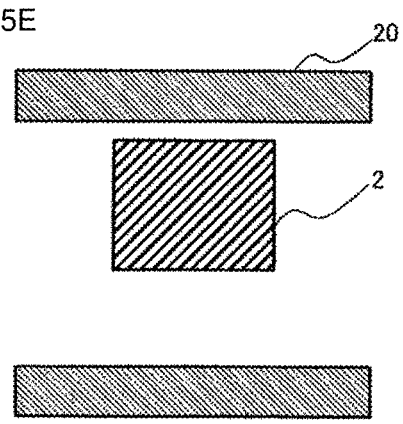

FIG. 5B shows an example of arrangement in which the bias magnets 20 deviate in a different orientation from the example of FIG. 5A. FIG. 5C shows an example of arrangement in which the positions of the bias magnets 20 deviate. FIG. 5D shows an example of arrangement in which the orientation of the magnetic sensor 2 deviates relative to the bias magnets 20. FIG. 5E shows an example of arrangement in which the position of the magnetic sensor 2 deviates relative to the bias magnets 20.

As shown in FIGS. 5A to 5E, there are various states of mounting variations in the current sensor 1, and it is presumed that the offset magnetic field Bofs can have various values according to each of the states. Thus, the parameters Bofs, V1 are unique values for each individual current sensor 1, and it is imaginable that the parameters Bofs, V1 vary among the current sensors 1. For this reason, in the first preferred embodiment, a method of, for example, in manufacturing inspection of current sensors 1, easily setting an offset adjusting value Vofs of each current sensor 1 instead of quantitatively measuring each individual offset magnetic field Bofs is provided. Hereinafter, the details of the operation of the current sensor 1 according to the first preferred embodiment will be described.

2-2. Temperature Compensation

Figure 6A:
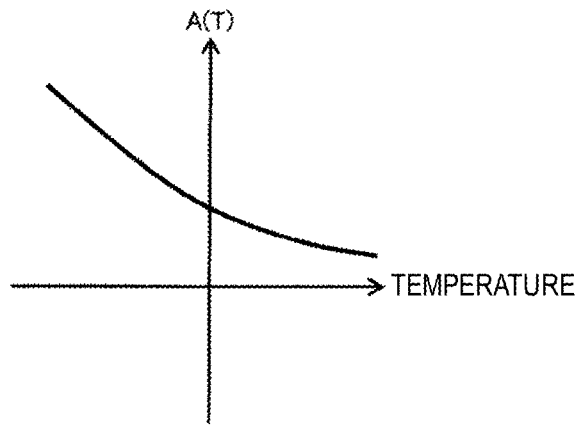
FIGS. 6A to 6C show graphs of temperature compensation of the current sensor.
Figure 6B:
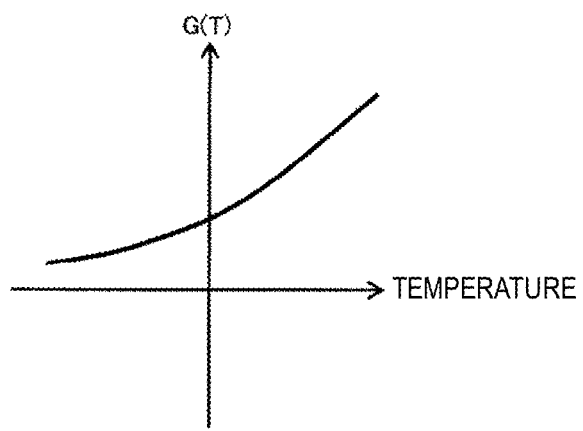
Figure 6C:
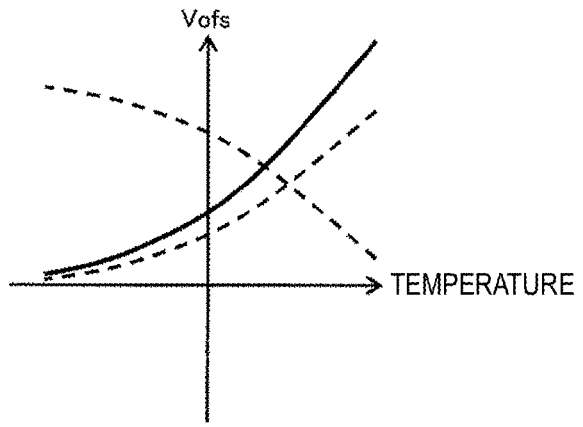

The details of temperature compensation of the current sensor 1 according to the first preferred embodiment will be described with reference to FIGS. 6A to 6C. FIGS. 6A to 6C is a graph of temperature compensation of the current sensor 1.

FIG. 6A shows an example of the temperature characteristics of the magnetoelectric conversion gain A(T) of the magnetic sensor 2. FIG. 6B shows the amplification rate G(T) for the magnetoelectric conversion gain A(T) of FIG. 6A. FIG. 6C shows the offset adjusting value Vofs commensurate with the amplification rate G(T) of FIG. 6B.

In the example of FIG. 6A, the magnetoelectric conversion gain A(T) of the magnetic sensor 2 nonlinearly changes with the temperature T. The temperature characteristics of the magnetoelectric conversion gain A(T) can be, for example, measured by using a sensor voltage Vin that is obtained by inputting the same signal magnetic field Bsig to the magnetic sensor 2 over various temperatures T.

In the current sensor 1 according to the first preferred embodiment, the amplification rate G(T) and offset adjusting value Vofs that are set in association with the magnetoelectric conversion gain A(T) of FIG. 6A are respectively shown in FIGS. 6B and 6C.

In the first preferred embodiment, the amplification rate G(T) (FIG. 6B) is set to a predetermined value to satisfy the following mathematical expression (4) to correct variations (FIG. 6A) in magnetoelectric conversion gain A(T) due to the temperature T in the output voltage Vout of the current sensor 1.

$$G(T) = k/A(T) \qquad (4)$$

The amplification rate G(T) of the above mathematical expression (4) can be calculated based on, for example, a measured result of the magnetoelectric conversion gain A(T) and is stored in association with the temperature T in the memory 15 of the current sensor 1. According to the amplification rate G(T) of the above mathematical expression (4), the output voltage Vout (see the mathematical expression (1)) of the current sensor 1 is calculated as in the following mathematical expression (5) for the sensor voltage Vin of the mathematical expression (3).

$$Vout = k \times Bsig + k \times Bofs - V1 \times G(T) + Vofs \quad (5)$$

In the first preferred embodiment, the offset adjusting value Vofs is set such that the output voltage Vout (that is, the offset voltage V0(T)) under the state where the signal magnetic field Bsig is zero in the mathematical expression (5) is the reference value "0". In other words, the offset adjusting value Vofs is set to a predetermined value to satisfy the following mathematical expression (6).

$$Vofs = -k \times Bofs + V1 \times G(T) \quad (6)$$

In the above mathematical expression (6), two variables, that is, the first term "−k×Bofs" and the second term "V1" on the right-hand side, are unique values for each individual current sensor 1 as described above (see FIGS. 4A and 4B). For this reason, as shown in FIG. 6C, a temperature change in the offset adjusting value Vofs becomes a functional form commensurate with the amplification rate G(T) (FIG. 6B) and varies among the different current sensors 1.

The offset adjusting value Vofs of the mathematical expression (6) can be calculated from the mathematical expression (6) by obtaining the values of the above-described two variables for each individual current sensor 1. For example, the offset adjusting value Vofs of the mathematical expression (6) is stored in the memory 15 of the current sensor 1 in association with the temperature T. The obtained values of the two variables may be stored in the memory 15. In this case, the controller 14 may calculate the offset adjusting value Vofs in real time by performing computation of the mathematical expression (6) based on the amplification rate G(T) corresponding to the temperature T detected by the temperature sensor 11, and the stored values of the two variables.

The above-described amplification rate G(T) and offset adjusting value Vofs are applied according to the temperature T at the time when the current sensor 1 measures a current. Thus, temperature compensation of the current sensor 1 is accurately made. For example, even when the temperature dependence of the magnetoelectric conversion gain A(T) of the magnetic sensor 2 is not linear as in the case of the example of FIG. 6A, correction can be performed by using the amplification rate G(T) such that the slope of the output voltage Vout to the signal magnetic field Bsig is constant or substantially constant. In addition, a temperature drift of the current sensor 1 is reduced by cancelling non-linear temperature variations in the offset voltage V0(T) with the use of the offset adjusting value Vofs.

2-3. Manufacturing Method for Current Sensor

Figure 7:
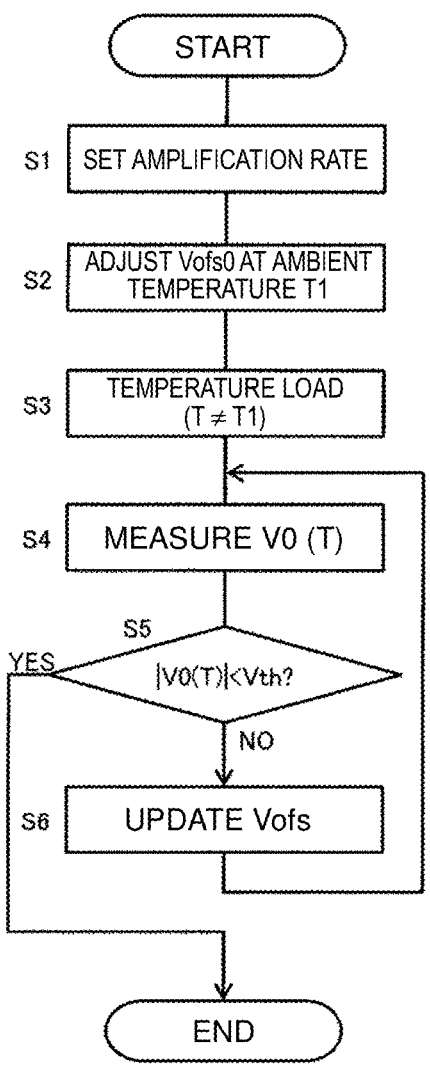
FIG. 7 is a flowchart showing a method of setting the current sensor according to the first preferred embodiment of the present invention.

The above-described offset adjusting value Vofs and amplification rate G(T) are set for each individual current sensor 1 during, for example, mass production of the current sensor 1. Hereinafter, a method of setting an offset adjusting value Vofs and an amplification rate G(T) during manufacturing of the current sensor 1 will be described with reference to FIG. 7 and FIGS. 8A and 8B. FIG. 7 is a flowchart showing a method of setting the current sensor 1.

The flowchart of FIG. 7 is started in a state where the current sensor 1 before shipment is prepared in, for example, the inspection step during manufacturing and shipment of the current sensor 1. The current sensor 1 is prepared up to the above-described state where the basic operation is executable. Processes in the flowchart are executed by, for example, an inspector using a predetermined controller (for example, a PC or various inspection devices). Hereinafter, an environment temperature at the time of executing this method is assumed as T1 (an example of a first temperature).

In the flowchart of FIG. 7, first, the amplification rate G(T) is set in the prepared current sensor 1 (S1). In step S1, the controller writes the amplification rate G(T) in the memory 15 of the current sensor 1 in association with the temperature T. For example, G(T)=G0×E(T) is used, and the same value is set for the function E(T) of the temperature T in all the current sensors 1 or the current sensors 1 in the same lot. A coefficient G0 is, for example, individually adjusted based on the output voltage Vout, or the like, at the environment temperature T1 for each individual current sensor 1.

Subsequently, initial setting of the offset adjusting value Vofs is performed based on the offset voltage V0(T1) of the current sensor 1 at the environment temperature T1 (S2). In step S2, the output voltage Vout (=V0(T1)) of the current sensor 1 under the state where the signal magnetic field Bsig is zero is measured, and an initial value Vofs0 is set to the offset adjusting value Vofs, and the offset voltage V0(T1) becomes "0". The initial value Vofs0 is set in, for example, the functional form of the following mathematical expression (7).

$$Vofs0 = V10 \times G(T) \quad (7)$$

In the mathematical expression (7), V10 is an initial value of the voltage parameter V1. In the mathematical expression (7), the initial value of the first term of the mathematical expression (6) is "0".

Subsequently, the temperature T of the current sensor 1 is changed from the environment temperature T1 by exerting a temperature load on the current sensor 1 (S3). In step S3, a changed temperature T (an example of a second temperature) does not need to be controlled to a specific temperature and just needs to be different from the environment temperature T1. A simple method may be used. Examples of the simple method include increasing the temperature of the current sensor 1 to a temperature higher than the environment temperature T1 by sending hot air and decreasing the temperature of the current sensor 1 to a temperature lower than the environment temperature T1 by sending cool air.

Subsequently, the offset voltage V0(T) of the current sensor 1 at the changed temperature T is measured (S4). The offset voltage V0(T) in step S4 is measured based on the output voltage Vout of the current sensor 1 in a state where the offset adjusting value Vofs, such as the initial value Vofs0, is set.

Subsequently, it is determined whether the absolute value |V0(T)| of the measured offset voltage V0(T) is greater than a predetermined threshold Vth (S5). The threshold Vth is set to a predetermined value, for example, according to tolerance by which a temperature drift in the current sensor 1 is allowed.

When |V0(T)|>Vth (Yes in S5), it is presumed that the offset voltage V0(T) has drifted and the set offset adjusting value Vofs deviates at the changed temperature T. Therefore, the offset adjusting value Vofs is updated, and the distribution of the values of the two variables in the above-described mathematical expression (6) is changed (S6). Step S6 is executed by the controller rewriting the offset adjusting value Vofs set in the current sensor 1 as in the case of the following mathematical expression (8).

$$Vofs = Vofs + \Delta Bofs \times k(1 - G(T)/G(T1)) \quad (8)$$

In the mathematical expression (8), the left-hand side represents an updated offset adjusting value, and the first term on the right-hand side represents an offset adjusting value (for example, Vofs0) before update. ΔBofs that is the first term on the right-hand side is a small amount having a predetermined absolute value that increments or decrements the offset adjusting value Vofs. The absolute value of the small amount ΔBofs is, for example, set based on the minimum unit of a value recordable on the memory 15.

In step S6, the sign of the small amount ΔBofs is selected according to the positive or negative sign of the temperature drift of the offset voltage V0(T). For example, the controller selects the sign of the small amount ΔBofs such that the second term on the right-hand side of the mathematical expression (8) is negative when V0(T)>Vth and selects the sign of the small amount ΔBofs such that the term is positive when V0(T)<Vth.

When the offset adjusting value Vofs has been updated (S6), the offset voltage V0(T) is measured again by using the updated offset adjusting value Vofs (S4). Thus, until |V0(T)|≤Vth, update of the offset adjusting value Vofs for each small amount ΔBofs is repeated (S4 to S6).

When |V0(T)|≤Vth is satisfied (No in S5), the method of setting the current sensor 1 through the flowchart of FIG. 7 ends.

With the above-described setting method, the updated offset adjusting value Vofs satisfies the mathematical expression (6) within the range of tolerance corresponding to the threshold Vth. In this way, an offset adjusting value Vofs appropriate for each individual current sensor 1 can be set based on the output of the current sensor 1, measured at the environment temperature T1, and the output of the current sensor 1, measured at the temperature T under a temperature load (≠T1). The above-described setting does not require accurate control over the temperature T and can be easily performed.

With the process of step S1, setting of an amplification rate G(T) in a plurality of the current sensors 1 is easily performed. Since the temperature characteristics of the amplification rate G(T) are assumed to have small variations among the current sensors 1 as compared to the offset magnetic field Bofs, or the like, the amplification rate G(T) that complies with the mathematical expression (4) can be accurately set in step S1.

The above-described setting method may be performed together with various calibrations of the current sensor 1. For example, in step S2, or the like, various parameters of the magnetic sensor 2, or the like, may be adjusted by measuring various outputs of the current sensor 1 at the environment temperature T1.

Figure 8A:
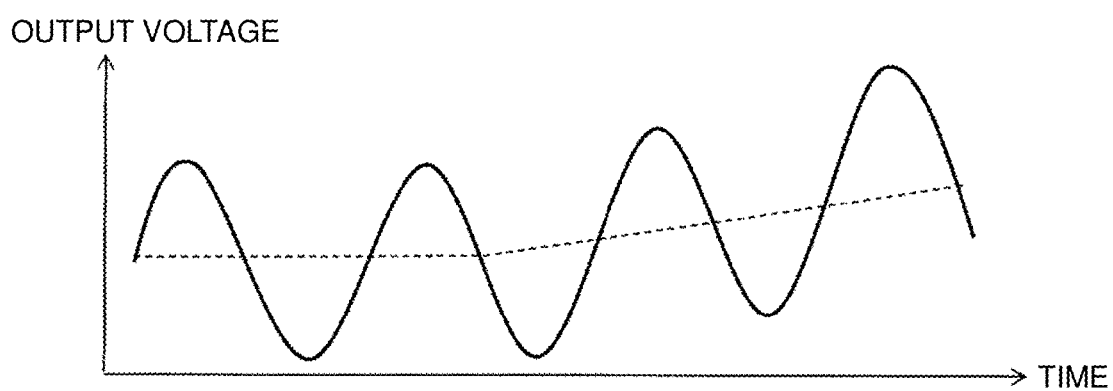
FIGS. 8A and 8B show graphs regarding a method of monitoring an offset voltage in the current sensor.
Figure 8B:
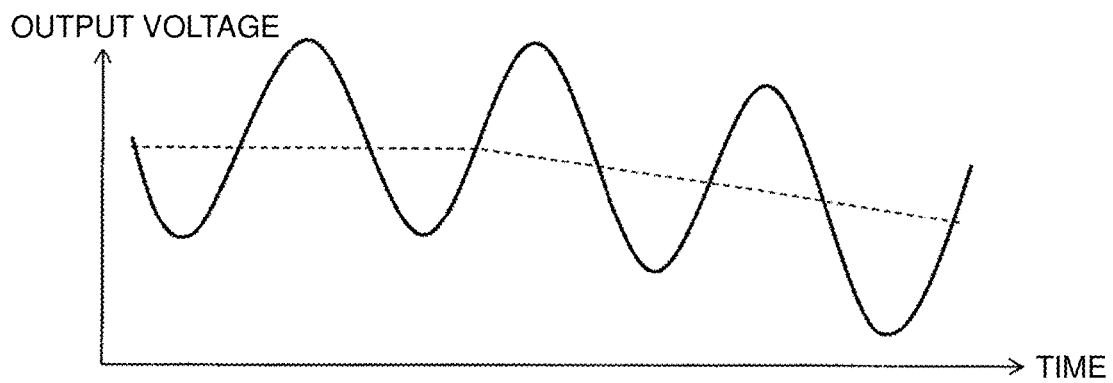

Step S3 and step S4 may be performed by monitoring a change in offset voltage V0(T). This method will be described with reference to FIGS. 8A and 8B. FIGS. 8A and 8B show graphs regarding a method of monitoring an offset voltage V0(T).

FIG. 8A is a graph that shows the case where the offset voltage V0(T) drifts positively. FIG. 8B is a graph that shows the case where the offset voltage V0(T) drifts negatively.

In the method of FIGS. 8A and 8B, the current sensor 1 is attached to a busbar, or the like, and, for example, a sinusoidal-waveform alternating current is caused to pass through the busbar. At this time, a temperature rise occurs as a result of energization of the busbar. Therefore, when there is a temperature drift in the offset voltage V0(T), the output voltage of the current sensor 1 varies as shown in FIG. 8A or 8B. The offset voltage V0(T) can be monitored by, for example, measuring the voltage at a midpoint in the sinusoidal waveform of output voltage.

The above-described monitoring method is applicable to a current value calibration process, or the like, for example, when a current sensor is integrally formed with a busbar. Thus, during manufacturing of the current sensor 1, the offset adjusting value Vofs can be easily set.

3. Summary

As described above, the current sensor 1 according to the first preferred embodiment outputs an output voltage Vout as an output signal based on a signal magnetic field Bsig that is generated by a current I to be measured. The current sensor 1 includes the magnetic sensor 2, the temperature sensor 11 that is an example of a temperature sensor, the amplifier 12, and the offset adjusting circuit 13. The magnetic sensor 2 generates a sensor voltage Vin as a sensor signal commensurate with the signal magnetic field Bsig. The temperature sensor 11 detects an ambient temperature T. The amplifier 12 generates the output voltage Vout by amplifying the sensor voltage Vin at an amplification rate G(T) corresponding to the detected temperature T. The offset adjusting circuit 13 adjusts an offset voltage V0(T) from the reference value "0" in the output voltage Vout under no signal magnetic field Bsig with the use of the offset adjusting value Vofs. The offset adjusting circuit 13 generates the offset adjusting value Vofs to adjust the offset voltage V0(T) in accordance with the relationship (mathematical expression (6)) that holds between an output voltage Vout (=V0(T)) under no signal magnetic field Bsig and an amplification rate G(T) corresponding to a temperature T.

With the above-described current sensor 1, for example, even when the offset voltage V0(T) in the output voltage Vout has nonlinear temperature characteristics, a temperature drift of the offset voltage V0(T) is reduced by the offset adjusting circuit 13.

In the first preferred embodiment, the amplification rate G(T) of the amplifier 12 is set to a predetermined value to correct variations, commensurate with the temperature T, in the magnetoelectric conversion gain A(T) for the magnetic sensor 2 to generate the sensor voltage Vin (see the mathematical expression (4)). Accordingly, even when the magnetoelectric conversion gain A(T) has nonlinear temperature dependence, temperature compensation can be accurately made.

In the first preferred embodiment, the current sensor 1 further includes the bias magnets 20 that are an example of a magnetic field source. The bias magnets 20 generate a bias magnetic field Bbis in a vicinity of the magnetic sensor 2. The offset adjusting circuit 13 generates the offset adjusting value Vofs to adjust the offset voltage V0(T) in accordance with the relationship (mathematical expression (6)) that holds between an output voltage Vout (=V0(T)) under no signal magnetic field Bsig and each of an offset magnetic field Bofs in a bias magnetic field Bbis and an amplification rate G(T) corresponding to a temperature T. Thus, even when there is a potential offset magnetic field Bofs together with a voltage parameter V1 as a factor of a temperature drift of the offset voltage V0(T), temperature compensation can be accurately made.

In the first preferred embodiment, the offset adjusting value Vofs (or the corresponding offset voltage V0(T)) includes the first term of the mathematical expression (6) that is a first component commensurate with the offset magnetic field Bofs and the second term of the mathematical expression that is a second component commensurate with variations, commensurate with a temperature, in the amplification rate G(T). When offset adjustment is performed in consideration of the first and second components, a temperature drift can be accurately reduced.

In the first preferred embodiment, the offset adjusting circuit 13 is provided on the output side of the amplifier 12. The current sensor 1 further includes the controller 14 that controls the offset adjusting circuit 13 based on the temperature T detected by the temperature sensor 11. In the present preferred embodiment, a temperature drift at the time of measurement of a current I is reduced under control of the controller 14.

In the first preferred embodiment, the current sensor 1 further includes the memory 15 that stores information that indicates the amplification rate G(T). The controller 14 is able to control the amplifier 12 by using the information stored in the memory 15.

In the first preferred embodiment, the bias magnets 20 are located adjacent to or in a vicinity of the magnetic sensor 2 such that the direction of the bias magnetic field Bbis to be generated intersects with the direction of the signal magnetic field Bsig. The dynamic range of the current sensor 1 can be ensured by the bias magnetic field Bbis.

The manufacturing method for the current sensor 1 according to the present preferred embodiment includes a step of preparing the current sensor 1. This step prepares the current sensor 1 such that the current sensor 1 includes the magnetic sensor 2, the temperature sensor 11, the amplifier 12, and the offset adjusting circuit 13. This method includes a step (S2) of measuring the output voltage Vout of the current sensor 1 at a first temperature T1, and a step (S4) of measuring the output voltage Vout of the current sensor 1 at a second temperature T ($\neq$T1). In this method, the offset adjusting circuit 13 is set based on the output voltage Vout measured at the first temperature T1 and the output voltage Vout measured at the second temperature T (S6). With this method, setting of the offset adjusting circuit 13 can be easily performed based on the measured results at the two temperatures T1, T.

In the manufacturing method for the current sensor 1 according to the present preferred embodiment, the bias magnets 20 that generate the bias magnetic field Bbis are provided adjacent to or in a vicinity of the magnetic sensor 2 in the current sensor 1. For the current sensor 1, the offset adjusting value Vofs that complies with the mathematical expression (6) can be easily set without measuring the offset magnetic field Bofs. This method may also be applied to a current sensor that does not include the bias magnets 20.

Second Preferred Embodiment

In the first preferred embodiment, the current sensor that includes the single magnetic sensor is described. In a second preferred embodiment of the present invention, a current sensor that includes two magnetic sensors will be described with reference to FIG. 9 to FIG. 12.

Figure 9:
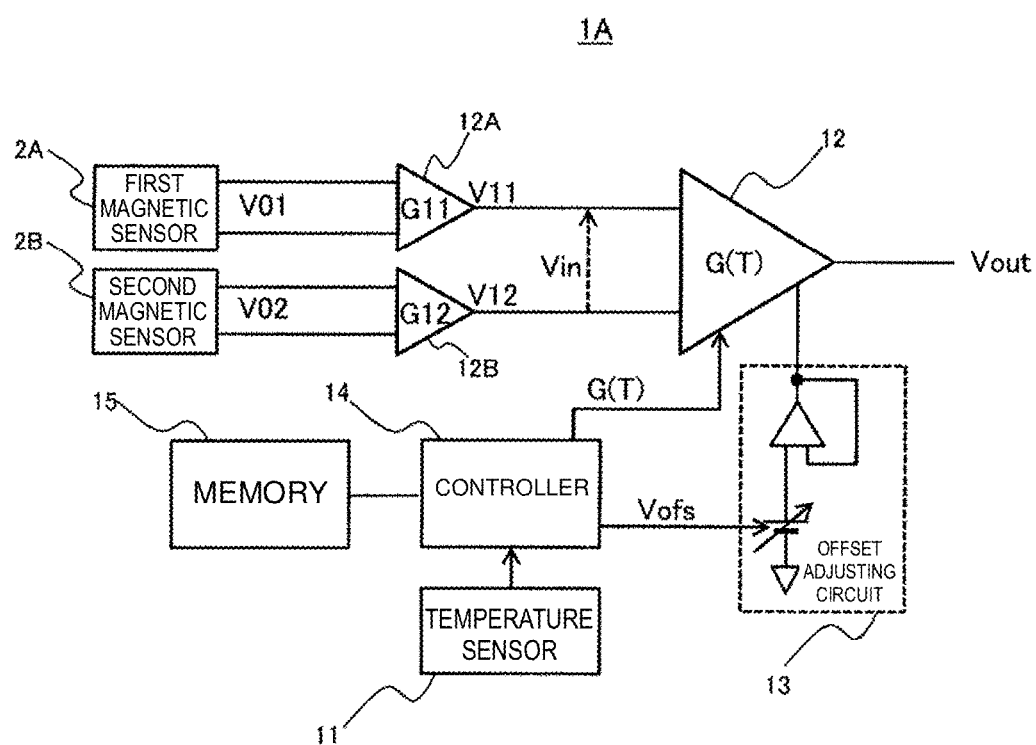
FIG. 9 is a diagram that shows a current sensor according to a second preferred embodiment of the present invention.

FIG. 9 is a diagram that shows the current sensor 1A according to the second preferred embodiment. The current sensor 1A according to the second preferred embodiment includes first and second magnetic sensors 2A, 2B instead of the single magnetic sensor 2 with similar features and structure as that of the current sensor 1 of the first preferred embodiment. In addition, as shown in FIG. 9, the current sensor 1A includes two amplifiers 12A, 12B respectively connected to the magnetic sensors 2A, 2B.

The first and second magnetic sensors 2A, 2B are similar to the magnetic sensor 2 of the first preferred embodiment, and respectively generate sensor voltages V01, V02. Each of the magnetic sensors 2A, 2B is connected to the amplifier 12 via an associated one of the amplifiers 12A, 12B.

The amplifier 12A for the first magnetic sensor 2A has a gain G11, and outputs a voltage V11 (=G11×V01). The amplifier 12B for the second magnetic sensor 2B has a gain G12, and outputs a voltage V12 (=G12×V02). Each of the gains G11, G12 is, for example, a constant value that does not depend on temperature. Each of the gains G11, G12 is adjusted to a predetermined value, for example.

In the second preferred embodiment, the sensor voltages V01, V02 of the magnetic sensors 2A, 2B are differentially input to the amplifier 12 via the associated amplifiers 12A, 12B as an input voltage Vin (=V11−V12). The current sensor 1A according to the second preferred embodiment, as in the case of the first preferred embodiment, is able to accurately make temperature compensation by setting the offset adjusting value Vofs and the amplification rate G(T).

Figure 10:
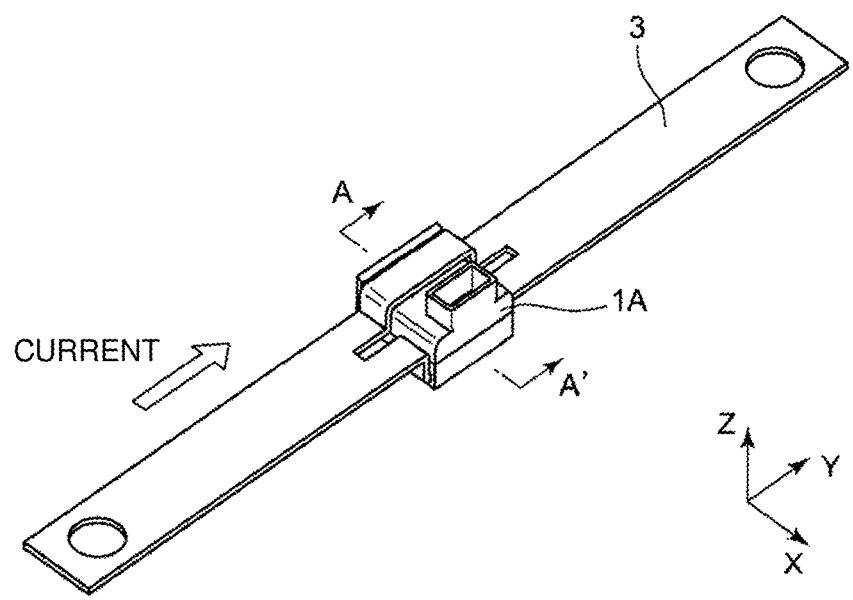
FIG. 10 is a perspective view that shows the appearance of the current sensor according to the second preferred embodiment of the present invention.

FIG. 10 is a perspective view that shows the appearance of the current sensor 1A according to the second preferred embodiment. For example, as shown in FIG. 10, the current sensor 1A is attached to a busbar 3 through which a current to be measured passes. Hereinafter, the width direction of the busbar 3 is defined as X direction, the long-side direction is defined as Y direction, and the thickness direction is defined as Z direction. A current to be measured by the current sensor 1A passes through the busbar 3 along the Y direction.

Figure 11:
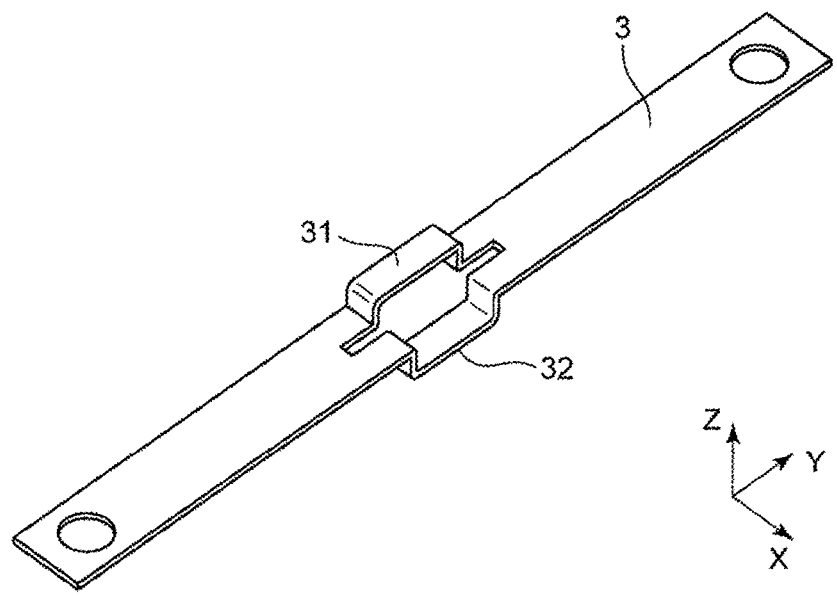
FIG. 11 is a perspective view that shows the appearance of a busbar to which the current sensor is attached.

FIG. 11 is a perspective view that shows the appearance of the busbar 3 to which the current sensor 1A of FIG. 10 is attached. As shown in FIG. 11, the busbar 3 splits into a first channel 31 and a second channel 32. In the current sensor 1A of FIG. 10, the first and second magnetic sensors 2A, 2B are disposed side by side in the X direction between the first and second channels 31, 32. In the current sensor 1A of the second preferred embodiment, the two bias magnets 20 (FIG. 2) similar to those of the first preferred embodiment are arranged in the Y direction via an associated one of the magnetic sensors 2A, 2B.

Figure 12:
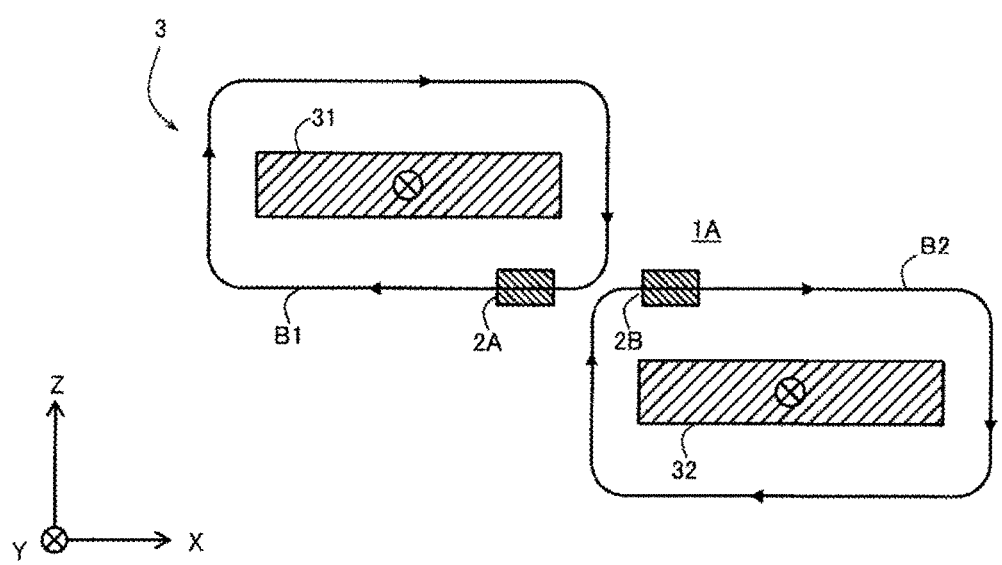
FIG. 12 is a view of the operation of the current sensor according to the second preferred embodiment of the present invention.

FIG. 12 is a view of the operation of the current sensor 1A according to the second preferred embodiment. FIG. 12 shows the channels 31, 32 and the magnetic sensors 2A, 2B adjacent to or in a vicinity of the A-A' cross section of FIG. 10 (see FIG. 11).

FIG. 12 shows a signal magnetic field B1 that is generated in a vicinity of the first channel 31 and a signal magnetic field B2 that is generated in a vicinity of the second channel 32 when a current passes in +Y direction in the long-side direction (Y direction) of the busbar 3. In the busbar 3, a current is diverted and passes through the first channel 31 and the second channel 32, so, as shown in FIG. 12, the signal magnetic field B1 in a vicinity of the first channel 31 orbits around the first channel 31, and the signal magnetic field B2 in a vicinity of the second channel 32 orbits around the second channel 32.

In the current sensor 1A according to the second preferred embodiment, a current flows in the same direction (for example, +Y direction) through the first channel 31 and the second channel 32, so the signal magnetic field B1 in a vicinity of the first channel 31 and the signal magnetic field B2 in a vicinity of the second channel 32 have the same orbit direction (for example, in a clockwise direction). For this reason, in the region between the first and second channels 31, 32, as shown in FIG. 12, an X component of the signal magnetic field B1 in a vicinity of the first channel 31 and an X component of the signal magnetic field B2 in a vicinity of the second channel 32 are opposite from each other. Thus, the signal magnetic fields B1, B2 in opposite phases from each other are input to the first and second magnetic sensors 2A, 2B disposed in the above region.

The first magnetic sensor 2A generates a sensor voltage V01 commensurate with an input magnetic field as a detected result of the signal magnetic field B1 in a vicinity of the first channel 31 (see FIG. 9). The second magnetic sensor 2B generates a sensor voltage V02 commensurate with an input magnetic field as a detected result of the signal magnetic field B2 in a vicinity of the second channel 32.

It is assumed that magnetic fields that are input to the magnetic sensors 2A, 2B include not only the signal magnetic fields B1, B2 but also noise, such as disturbance magnetic fields. Such a noise is presumably input to the magnetic sensors 2A, 2B in the same phase (in the same orientation and the magnitude of the same level) when the arrangement positions of the first and second magnetic sensors 2A, 2B are brought close to each other.

Therefore, in the current sensor 1A (FIG. 9) according to the second preferred embodiment, the voltages V11, V12 corresponding to the sensor voltages V01, V02 are differentially amplified in the amplifier 12. Thus, a signal magnetic field caused by a current to be measured can be accurately detected by cancelling noise that can be included in the output voltages of the magnetic sensors 2A, 2B in the same phase. Accordingly, in the current sensor 1A, the magnitude of current to be measured can be accurately measured.

As described above, the current sensor 1A according to the second preferred embodiment includes the two magnetic sensors 2A, 2B. The amplifier 12 differentially amplifies the voltages V11, V12 corresponding to sensor signals from the two magnetic sensors 2A, 2B. With the current sensor 1A according to the second preferred embodiment as well, a temperature drift of the offset voltage V0(T) in the output voltage Vout based on differential amplification can be reduced.

In the above-described first and second preferred embodiments, the current sensors that include one or two magnetic sensors are described. Alternatively, a current sensor may include three or more magnetic sensors. In this case as well, a temperature drift of an output signal of the current sensor can be reduced.

Third Preferred Embodiment

In the first and second preferred embodiments, the offset adjusting circuit 13 is provided on the output side of the amplifier 12. In a third preferred embodiment of the present invention, a current sensor in which an offset adjusting circuit is provided on an input side of an amplifier will be described with reference to FIG. 13 to FIG. 15.

Figure 13:
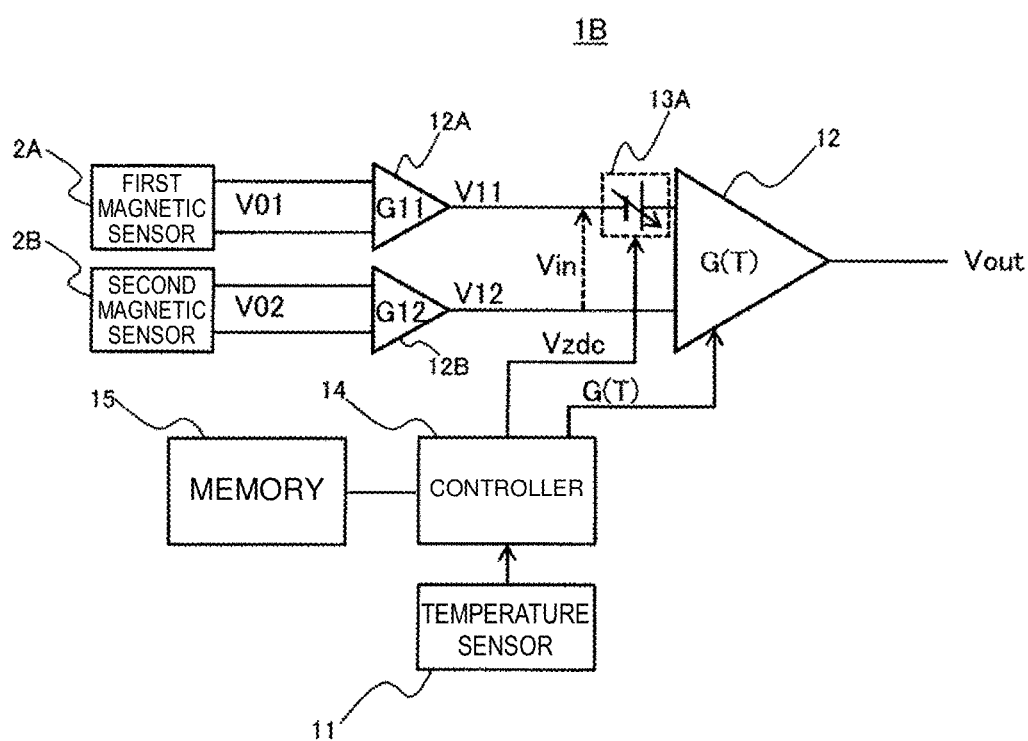
FIG. 13 is a diagram that shows a current sensor according to a third preferred embodiment of the present invention.

FIG. 13 is a diagram that shows the current sensor 1B according to the third preferred embodiment. The current sensor 1B according to the third preferred embodiment includes an offset adjusting circuit 13A located on the input side of the amplifier 12, instead of the offset adjusting circuit 13, with similar features and structure as that of the current sensor 1A of the second preferred embodiment. The offset adjusting circuit 13A of the third preferred embodiment, for example, includes a variable voltage source and other components as in the case of the first and second preferred embodiments and is connected to one of two input terminals of the amplifier 12.

The offset adjusting circuit 13A of the third preferred embodiment adjusts the offset of the output voltage Vout of the amplifier 12 by controlling a voltage difference between the input terminals of the amplifier 12 when the input voltage Vin is zero. For example, the offset adjusting circuit 13A generates a voltage Vzdc (input offset adjusting value) of a value set in the variable voltage source and adds the generated voltage to the input voltage Vin. Thus, the amount of increase in the output voltage Vout of the amplifier 12 is $G(T) \times Vzdc$. In the third preferred embodiment, the input offset adjusting value Vzdc is set to a predetermined value to satisfy the following mathematical expression (30).

$$Vzdc = -k \times Bofs/G(T) + V1 \quad (30)$$

With the input offset adjusting value Vzdc of the mathematical expression (30), similar advantageous effects to the case where the offset adjusting value Vofs of the mathematical expression (6) is used on the output side of the amplifier 12 are obtained. Thus, with the current sensor 1B according to the third preferred embodiment as well, a temperature drift of the offset voltage V0(T) can be reduced as in the case of the first and second preferred embodiments.

For the current sensor 1B, the inventors of preferred embodiments of the present invention performed verification experiments on the advantageous effects of reducing a temperature drift. The verification experiments of the inventors of preferred embodiments of the present invention will be described with reference to FIG. 14 and FIG. 15.

Figure 14:
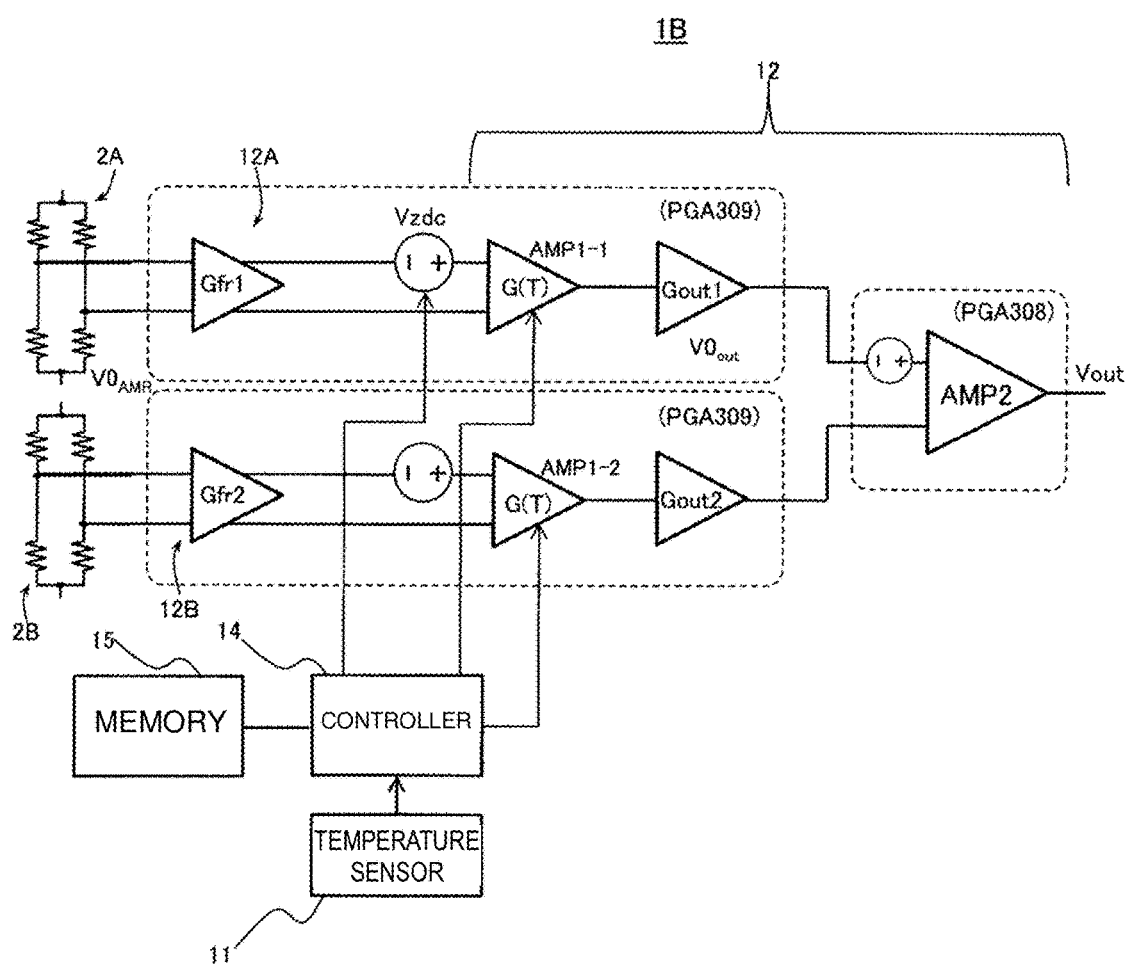
FIG. 14 is a diagram that shows a current sensor in verification experiments.

FIG. 14 is a diagram that shows the current sensor 1B in the verification experiments. In the experiments, the current sensor 1B was made using a programmable gain/offset amplifier made by TI. Specifically, as shown in FIG. 14, two PGAs 309 and one PGA 308 were used. Temperature compensation using the amplification rate G(T) was made on each PGA 309. The input offset adjusting value Vzdc was set in one of the PGAs 309. A Wheatstone bridge circuit of AMR elements was used as a magnetic sensor.

In the experiments, the advantageous effect of reducing a temperature drift in the case where the input offset adjusting value Vzdc was set in the current sensor 1B of FIG. 14 with a similar setting method to that of FIG. 7 was verified. First, the initial value Vzdc0 of the input offset adjusting value Vzdc at the environment temperature T1 was set as expressed by the mathematical expression (31) (see S2 in FIG. 7).

$$Vzdc0 = Vm/Gout1 - V0_{out}/G(T) + Gfr1 \times V0_{AMR} \quad (31)$$

In the mathematical expression (31), Vm was an ideal midpoint potential, and Vm was set to about 2.5 V. Gout1 and Gfr1 were gains of the amplifiers in the PGA 309 of FIG. 14. $V0_{AMR}$ and $V0_{out}$ were offset components in the magnetic sensor and PGA 309 in FIG. 14.

After setting of the initial value Vzdc0 at the environment temperature T1 as described above, the current sensor 1B was heated with a drier (S3 in FIG. 7). While the offset voltage V0(T) of the current sensor 1B was being monitored, the input offset adjusting value Vzdc was updated as expressed by the following mathematical expression (32) (S4 to S6).

$$Vzdc = Vzdc + \Delta V(1 - G(T1)/G(T)) \quad (32)$$

In the mathematical expression (32), $\Delta V$ is a small amount for the input offset adjusting value Vzdc. The input offset adjusting value Vzdc was updated by repeating incrementing (or decrementing) the small amount $\Delta V$, and a temperature drift of the offset voltage V0(T) was minimized (S4 to S6 in FIG. 7).

Figure 15:
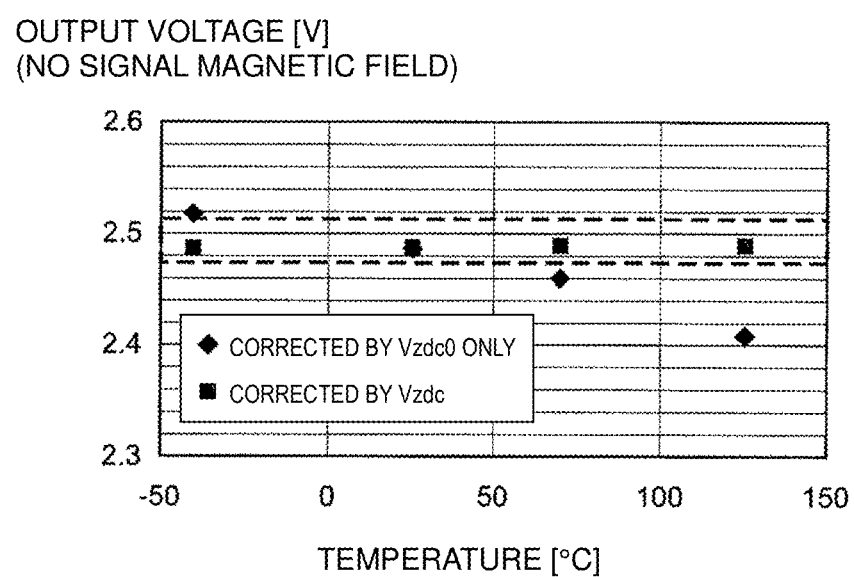
FIG. 15 is a graph that shows the results of verification experiments for the current sensor.

The input offset adjusting value Vzdc was determined using the above-described method, and the temperature characteristics of the offset voltage V0(T) was measured in a state where the determined input offset adjusting value Vzdc was set in the current sensor 1B. FIG. 15 shows the results of the above-described verification experiments.

FIG. 15 is a graph that shows the measured results of the temperature characteristics of offset voltage in the verification experiments on the current sensor 1B. The abscissa axis of FIG. 15 represents a temperature [° C.], and the ordinate axis represents an output voltage [V] under no signal magnetic field, that is, an offset voltage V0(T).

FIG. 15 shows the temperature characteristics of the case where the input offset adjusting value Vzdc was set without any update from the initial value Vzdc0 (mathematical expression (31)) at the environment temperature T1 and the temperature characteristics of the case where the input offset adjusting value Vzdc was updated through the mathematical expression (32) under a temperature load. As shown in FIG. 15, a temperature drift of about 110 mV was observed in correction of only Vzdc0 at the environment temperature T1, while a temperature drift was reduced to lower than or equal to about 5 mV as a result of correction of Vzdc updated through the mathematical expression (32). As described above, in the current sensor 1B of the third preferred embodiment, it was verified that a temperature drift could be reduced by a simple setting method.

As described above, in the current sensor 1B according to the third preferred embodiment, the offset adjusting circuit 13A is provided on the input side of the amplifier 12. In such a case as well, for example, when the controller 14 of the current sensor 1B controls the offset adjusting circuit 13A based on the temperature T detected by the temperature sensor 11, a temperature drift can be reduced as in the case of the first and second preferred embodiments.

In the above description, the example in which, in the current sensor 1B, the offset adjusting circuit 13A on the input side of the amplifier 12 is provided instead of the output side offset adjusting circuit 13 is described. Alternatively, in the current sensor 1B according to the third preferred embodiment, the offset adjusting circuits 13A, 13 may be provided respectively on the input side and output side of the amplifier 12.

Fourth Preferred Embodiment

In the first to third preferred embodiments, the controller 14 controls the amplifier 12 and the offset adjusting circuit 13 or the offset adjusting circuit 13A according to the temperature T. In a fourth preferred embodiment of the present invention, a current sensor that provides temperature compensation without a controller will be described.

Figure 16:
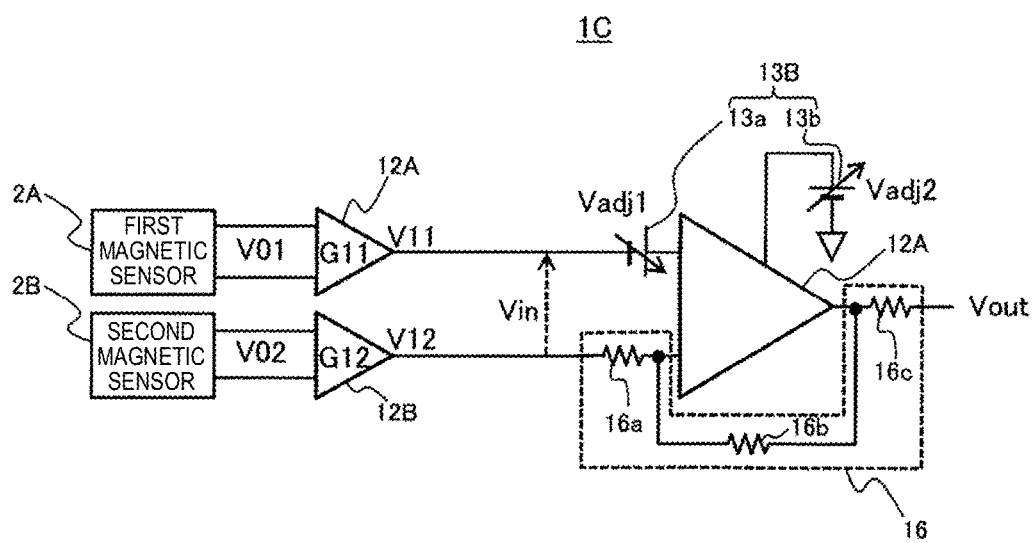
FIG. 16 is a diagram that shows a current sensor according to a fourth preferred embodiment of the present invention.

FIG. 16 is a diagram that shows the current sensor 1C according to the fourth preferred embodiment. The current sensor 1C according to the fourth preferred embodiment includes an offset adjusting circuit 13B including first and second adjusting circuits 13a, 13b as shown in FIG. 16 instead of the offset adjusting circuit 13 with similar features and structure as that of the current sensor 1A of the second preferred embodiment. The first adjusting circuit 13a is provided on the input side of the amplifier 12A in the current sensor 1C of the fourth preferred embodiment. The second adjusting circuit 13b is provided on the output side of the amplifier 12A.

The current sensor 1C according to the fourth preferred embodiment does not include, for example, the controller 14, the memory 15, and the temperature sensor 11 shown in FIG. 9, and includes an amplification rate setting circuit 16 that sets the amplification rate of the amplifier 12A. The amplification rate setting circuit 16 includes a plurality of resistors 16a, 16b, 16c. One or plurality of the resistors 16a to 16c are made up of various temperature sensing elements, such as thermistors. The resistors 16a to 16c of the amplification rate setting circuit 16 each are an example of a temperature sensor in the fourth preferred embodiment.

The temperature coefficients of resistance values of the resistors 16a to 16c of the amplification rate setting circuit 16 are set such that the amplification rate of the amplifier 12A becomes the amplification rate G(T) that corrects the temperature characteristics of the magnetic sensors 2A, 2B according to the ambient temperature T. Thus, without executing digital control or the like, temperature compensation of the amplification rate G(T) can be provided.

In the offset adjusting circuit 13B of the fourth preferred embodiment, the first and second adjusting circuits 13a, 13b each are, for example, a variable voltage source. The first adjusting circuit 13a generates a voltage Vadj1 (first adjusting value) of a value set in the variable voltage source. The second adjusting circuit 13a generates a voltage Vadj2 (second adjusting value) of a similarly set value. Thus, the offset adjusting circuit 13B incorporates the offset adjusting value Vofs of the following mathematical expression (40) into the output voltage Vout of the current sensor 1C.

$$Vofs = G(T) \times Vadj1 + Vadj2 \tag{40}$$

In the fourth preferred embodiment, the first and second adjusting circuits 13a, 13b of the offset adjusting circuit 13B are set such that the first adjusting value Vadj1 coincides with "V1" that is the second term of the mathematical expression (6) and the second adjusting value Vadj2 coincides with "−k×Bofs" that is the first term of the same mathematical expression. Thus, without executing digital control or the like, a temperature drift of the offset voltage V0(T) can be reduced.

Setting of the offset adjusting circuit 13B can be performed by using, for example, a similar setting method (FIG. 7) to that of the first preferred embodiment. Specifically, in step S6 of FIG. 7, the first and second adjusting values Vadj1, Vadj2 are updated as expressed by the following mathematical expressions (41), (42).

$$Vadj1 = Vadj1 + \Delta V \tag{41}$$

$$Vadj2 = Vadj2 - G(T) \times \Delta V \tag{42}$$

When adjustment is performed in units of the small amount ΔV by using the mathematical expressions (41), (42), the first and second adjusting values Vadj1, Vadj2 can be set to appropriate values.

As described above, in the current sensor 1C according to the fourth preferred embodiment, the offset adjusting circuit 13B includes the first adjusting circuit 13a provided on the input side of the amplifier 12A and the second adjusting circuit 13b provided on the output side of the amplifier 12A. The first adjusting circuit 13a adjusts a component corresponding to the second term of the mathematical expression (6) in the offset voltage V0(T) of the output voltage Vout. The second adjusting circuit 13b adjusts a component corresponding to the first term of the same mathematical expression. Thus, a temperature drift can be accurately reduced by implementing offset adjustment that complies with the mathematical expression (6).

In the above description, the example in which both the offset adjusting value Vofs and the amplification rate G(T) are controlled not under control of the controller 14 in the current sensor 1C is described. Alternatively, for example, in the current sensor 1C according to the fourth preferred embodiment, one of the offset adjusting value Vofs and the amplification rate G(T) may be controlled by the controller 14.

Other Preferred Embodiments

In the first preferred embodiment, the example in which the processes in the method of setting the current sensor 1 (FIG. 7) are executed by the controller outside the current sensor 1 is described. Alternatively, for example, a portion or all of the above-described processes may be executed by the controller 14 of the current sensor 1. For example, the controller 14 may be able to execute writing into the memory 15.

The example in which, after the update of the offset adjusting value Vofs in step S6 of FIG. 7, the offset voltage V0(T) is measured again is described. However, remeasurement of the offset voltage V0(T) may be omitted. For example, a sensor voltage Vin of the current sensor 1 at the time of measurement of an offset voltage V0(T) based on an initial value Vofs0 may be acquired and recorded in the controller and then an offset voltage V0(T) using a new offset adjusting value Vofs may be calculated.

The example in which the initial value Vofs0 of the offset adjusting value Vofs is set as expressed by the mathematical expression (7) (S2 in FIG. 7). However, setting of the initial value Vofs0 is not limited thereto. For example, the initial value may be set as expressed by "Vofs0=Bofs0×k" and, in step S6, the offset adjusting value may be updated as expressed by "Vofs=Vofs+ΔBofs×k(G(T1)−G(T))" instead of the mathematical expression (7).

In step S2 to step S6 of FIG. 7, the example in which the offset adjusting value Vofs is updated in units of the small amount ΔBofs is described. Alternatively, for example, two variables in the above-described mathematical expression (6) may be calculated based on the output voltages Vout measured at the two temperatures T1, T.

In the above-described preferred embodiments, the bias magnets 20 are described as a magnetic field source. However, the magnetic field source in the current sensor is not limited to bias magnets. For example, the magnetic field source in the current sensor may be, for example, a pin layer in a magnetic sensor made from a GMR element or a TMR element. In this case, the magnetic field source and the magnetic sensor are integrally formed. With a current sensor including such a magnetic field source as well, when the offset adjusting circuit adjusts an offset in accordance with the relationship that holds between an output signal under no signal magnetic field and each of a magnetic field generated by a magnetic field source and an amplification rate corresponding to a temperature, a temperature drift can be reduced.

In the above-described preferred embodiments, the case where the current sensor includes a magnetic field source is described. However, the current sensor does not need to include a magnetic field source. For example, when the magnetic sensor in the current sensor includes a Hall element, or the like, a magnetic field source need not be used. It is also assumed that the magnetic shape anisotropy of an element itself, such as a magnetoresistance element in the magnetic sensor, can be substantially a magnetic field source. In such a case as well, as in the case of the above-described preferred embodiments, when the offset adjusting circuit adjusts an offset in accordance with the relationship between an output signal under no signal magnetic field and an amplification rate corresponding to a temperature, a temperature drift can be reduced.

In the above-described preferred embodiments, the example in which the output signal and the sensor signal are respectively the output voltage Vout and the sensor voltage Vin is described. The output signal and the sensor signal in the current sensor are not limited to voltage signals and may be current signals. The output signal and the sensor signal each may be an analog signal or a digital signal. With the current sensor according to the present preferred embodiment, a temperature drift of an offset in various output signals can be reduced.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A current sensor that outputs an output signal according to a signal magnetic field that is generated by a current to be measured, the current sensor comprising:
    at least one magnetic sensor that generates a sensor signal commensurate with the signal magnetic field;
    a magnetic field source that generates a magnetic field in a vicinity of the at least one magnetic sensor;
    a temperature sensor that detects an ambient temperature;
    an amplifier that amplifies the sensor signal at an amplification rate corresponding to the detected temperature and generates the output signal; and
    an offset adjusting circuit that adjusts an offset that is a deviation of an output signal from a reference value under no signal magnetic field; wherein
    the offset adjusting circuit adjusts the offset in accordance with a relationship that is maintained between an output signal under no signal magnetic field and each of a magnetic field generated by the magnetic field source and an amplification rate corresponding to the temperature.

2. The current sensor according to claim 1, wherein the amplification rate of the amplifier is set to a predetermined value to correct variations, commensurate with the temperature, in magnetoelectric conversion gain for the magnetic sensor to generate the sensor signal.

3. The current sensor according to claim 2, wherein the offset includes a first component commensurate with a magnetic field generated by the magnetic field source and a second component commensurate with variations, commensurate with the temperature, in the amplification rate.

4. The current sensor according to claim 3, wherein the offset adjusting circuit includes:
    a first adjusting circuit provided on an input side of the amplifier, the first adjusting circuit adjusting the second component; and
    a second adjusting circuit provided on an output side of the amplifier, the second adjusting circuit adjusting the first component.

5. The current sensor according to claim 1, wherein
    the magnetic field source is located adjacent to or in a vicinity of the magnetic sensor; and
    a direction of the magnetic field to be generated intersects with a direction of the signal magnetic field.

6. The current sensor according to claim 1, wherein
    the offset adjusting circuit is provided on an output side of the amplifier; and
    the current sensor further includes a controller that controls the offset adjusting circuit according to the temperature detected by the temperature sensor.

7. The current sensor according to claim 1, further comprising a memory that stores information that indicates the amplification rate.

8. The current sensor according to claim 1, wherein
the at least one magnetic sensor includes two magnetic sensors; and
the amplifier differentially amplifies sensor signals from the two magnetic sensors.

9. A manufacturing method of a current sensor, the manufacturing method comprising:
a step of preparing the current sensor including a magnetic sensor that generates a sensor signal commensurate with a signal magnetic field that is generated by a current to be measured, a temperature sensor that detects an ambient temperature, an amplifier that amplifies the sensor signal at an amplification rate commensurate with the detected temperature and generates an output signal, and an offset adjusting circuit that adjusts an offset that is a deviation of an output signal from a reference value under no signal magnetic field;
a step of measuring the output signal of the current sensor at a first temperature;
a step of measuring the output signal of the current sensor at a second temperature different from the first temperature; and
a step of setting the offset adjusting circuit according to only the output signal measured at the first temperature and the output signal measured at the second temperature.

10. The manufacturing method of a current sensor according to claim 9, wherein the current sensor includes a magnetic field source that is located adjacent to or in a vicinity of the magnetic sensor and that generates a magnetic field.

11. The current sensor according to claim 1, wherein the at least one magnetic sensor includes a magnetoresistance element.

12. The current sensor according to claim 1, wherein the amplifier includes an amplification rate adjusting circuit that adjusts the amplification rate of the amplifier.

13. The current sensor according to claim 1, further comprising at least one bias magnet that magnetically biases the at least one magnetic sensor.

14. The current sensor according to claim 13, wherein
the at least one bias magnet includes two bias magnets;
the at least one magnetic sensor is located between the two bias magnets; and
a sensitive axis of the at least one magnetic sensor is parallel or substantially parallel to a direction of the signal magnetic field.

15. The current sensor according to claim 1, wherein the at least one magnetic sensor includes four magnetoresistance elements in a Wheatstone bridge circuit.

16. The current sensor according to claim 1, wherein
the at least one magnetic sensor includes a first magnetic sensor and a second magnetic sensor;
the first magnetic sensor is connected to the amplifier via a first amplifier; and
the second magnetic sensor is connected to the amplifier via a second amplifier.

17. A current measurement system, comprising:
a busbar; and
the current sensor according to claim 1; wherein
the current sensor is attached to the busbar and measures a current that passes through the busbar.

18. The current measurement system according to claim 17, wherein
the at least one magnetic sensor includes a first magnetic sensor and a second magnetic sensor;
the bulbar is at least partially divided into a first channel and a second channel;
the first magnetic sensor generates a sensor signal commensurate with a signal magnetic field in a vicinity of the first channel; and
the second magnetic sensor generates a sensor signal commensurate with a signal magnetic field in a vicinity of the second channel.

* * * * *